US005515309A

United States Patent [19]

Fong

[11] Patent Number: 5,515,309
[45] Date of Patent: May 7, 1996

[54] 1-BIT ADDER AND MULTIPLIER CONTAINING A 1-BIT ADDER

[75] Inventor: Joseph C. Y. Fong, Toulouse, France

[73] Assignee: Thomson Consumer Electronics S.A., Courbevoie, France

[21] Appl. No.: 211,898

[22] PCT Filed: Oct. 12, 1992

[86] PCT No.: PCT/EP92/02350

§ 371 Date: Jun. 20, 1994

§ 102(e) Date: Jun. 20, 1994

[87] PCT Pub. No.: WO93/08523

PCT Pub. Date: Apr. 29, 1993

[30] Foreign Application Priority Data

Oct. 21, 1991 [FR] France .................. 91 402797

[51] Int. Cl.⁶ .................................................. G06F 7/52
[52] U.S. Cl. .................................... 364/754; 364/759
[58] Field of Search .................................. 364/754–760, 364/764

[56] References Cited

U.S. PATENT DOCUMENTS

| 5,151,875 | 9/1992 | Sato | 364/784 |
| 5,235,537 | 8/1993 | McWhirter et al. | 364/736 |
| 5,291,431 | 3/1994 | Ho et al. | 364/760 |

OTHER PUBLICATIONS

IEEE International Solid State Circuits Conference, vol. 37, 15 Feb. 1990, New York US pp. 114–115, Yoshino et al "A 100 MHZ 64–Tap FIR Digital Filter in a 0.8 μm BiCMOS Gate Array".

Computer, vol. 11, No. 10 Oct. 1978, Long Beach US, pp. 19–29, Waser, "High–Speed Monolithic Multipliers for Real–Time Digital Signal Processing".

Journal of VLSI Signal Processing, vol. 2, No. 4, May 1991, Dordrecht NL, pp. 219–233, North et al. "β–bit Serial/Parallel Multipliers".

IEEE Journal of Solid–State Circuits, vol. SC–17, No. 5, Oct. 1982 New York US, pp. 898–907, Ware et al, "64 Bit Monolithic Floating Point Processors".

*Primary Examiner*—Roy N. Envall, Jr.
*Assistant Examiner*—Emmanuel L. Moise
*Attorney, Agent, or Firm*—Joseph S. Tripoli; Peter M. Emanuel; Richard G. Coalter

[57] ABSTRACT

A one-bit adder includes a carry stage and an adding stage and is constructed in a fast CMOS complementary pass transistor logic with complementary analog CMOS switches in the adding stage which consist of a PMOS and an NMOS transistor. The source of the PMOS transistor is connected with the drain of the NMOS transistor and the drain of the PMOS transistor is connected with the source of the NMOS transistor. The gate of the PMOS transistor receives inverted signals with respect to the gate of the NMOS transistor. Two partial output sum signals are generated by two of the switches which are connected with the input and with the output, respectively, of an inverter and the output sum signal of the adder is available at the output of the inverter.

A fast multiplier includes (i) a plurality of the above fast one-bit adders, (ii) reduction of partial products by application of a Booth-McSorley process, (iii) diagonal propagation of caries from one partial product to another allowing all sums on one line to be done simultaneously, and (iv) application of a carry select approach in the final 14 bits and in the first two adders in intermediate rows.

11 Claims, 16 Drawing Sheets

1-BIT ADDER AND MULTIPLIER CONTAINING A 1-BIT ADDER

The present invention relates to a 1-bit adder and to a multiplier which uses this 1-bit adder.

BACKGROUND

E.g. for video applications fast digital multipliers with high resolution are required. But a higher resolution results in more partial products to be calculated internally. The Booth-Mc Sorley algorithm can be used in order to reduce the required number of such partial products. This algorithm is disclosed in O. L. MAC SORLEY, 'High-Speed Arithmetic in Binary Computers', Proceedings of the IRE, January 1961, Vol. 49, Pages 67–91. This algorithm can be combined with a diagonal propagation of the carry from one partial product to the other, allowing all the sums on a line to be calculated simultaneously. But the reachable multiplication time is not short enough.

INVENTION

It is one object of the invention to disclose a 1-bit adder with improved speed. This object is reached by the inventive adder disclosed in claim 1.

In principle the inventive adder comprises a carry stage and an adding stage and is constructed in a fast CMOS complementary pass transistor logic with complementary analogue CMOS switches in said adding stage which consist of a PMOS and a NMOS transistor, whereby the source of said PMOS transistor is connected with the drain of said NMOS transistor and the drain of said PMOS transistor is connected with the source of said NMOS transistor and the gate of said PMOS transistor receives inverted signals with respect to the gate of said NMOS transistor, and whereby two partial output sum signals are generated by two of said switches which are connected with the input and with the output, respectively, of an inverter and the output sum signal of said adder is available at the output of said inverter.

Advantageous additional embodiments of the inventive adder are resulting from the respective dependent claim.

It is a further object of the invention to disclose a digital multiplier with improved speed which utilizes the inventive adder. This object is reached by the inventive multiplier disclosed in claim 3.

In principle the inventive multiplier uses Booth encoding of the multiplicator and diagonal propagation of the carry from one partial product to the other and comprises:

- a first row of function blocks which calculate partial products from the multiplicand and from a substring of the multiplicator which has been coded in a Booth encoder circuit;
- further rows of basic building blocks which contain one of said function blocks and one of said 1-bit adders and which calculate further partial products from the partial products from the previous row and from further substrings of the multiplicator, which have been coded in further Booth encoder circuits, whereby the respective two or more lowest multiplication result bits from each row are calculated using two of said 1-bit adders and whereby groups of such rows are connected by a pipeline row;
- a last row with a carry select adder circuit which is constructed from one 4- and/or 3-bit adder circuit and/or pairs of said 4- and/or 3-bit adder circuits, which contain said 1-bit adders.

Advantageous additional embodiments of the inventive multiplier are resulting from the respective dependent claims.

Extensive electrical simulations have shown that with 1.2μ CMOS technology (HF3CMOS) a multiplication time of 9 ns cannot be achieved in one step. Such a short multiplication time would normally need submicron MOS technology or the use of ECL techniques.

Several levels of pipeline are required within the inventive multiplier. Taking into account the delay of the input and output latches, the multiplier has an overall latency of 5 (i.e. 45 ns for a 108 MHz clock). For reducing the multiplication time within subblocks of the multiplier a carry select technique is used to have minimum propagation delay. For this reason, too, an inventive 1-bit full adder has been designed which uses complementary pass transistor logic. This adder has the advantage of giving full power supply swings at the outputs whilst still maintaining the speed properties of the pass transistor logic.

DRAWINGS

Preferred embodiments of the invention will now be described with reference to the accompanying drawings, in which.

PREFERRED EMBODIMENTS

A multiplication process can be viewed as consisting in two basic steps:

evaluation of partial products;

accumulation of the shifted partial products.

E.g. a four bits multiplicand (a3, a2, a1, a0) is multiplied with a four bits multiplicator (b3, b2, b1, b0) according to the following scheme, whereby the result (P7, P6, . . . , P0) has eight bits:

|  |  |  |  | a3 | a2 | a1 | a0 | multiplicand |
|--|--|--|--|--|--|--|--|--|
|  |  |  |  | b3 | b2 | b1 | b0 | multiplicator |
|  |  |  |  | a3b0 | a2b0 | a1b0 | a0b0 | partial product |
|  |  |  | a3b1 | a2b1 | a1b1 | a0b1 |  |  |
|  |  | a3b2 | a2b2 | a1b2 | a0b2 |  |  |  |
|  | a3b3 | a2b3 | a1b3 | a0b3 |  |  |  |  |
| P7 | P6 | P5 | P4 | P3 | P2 | P1 | P0 | multiplication result |

A number of techniques can be used to perform multiplication, namely:

serial multiplication;

serial/parallel multiplication;

parallel multiplication.

Figure 1:
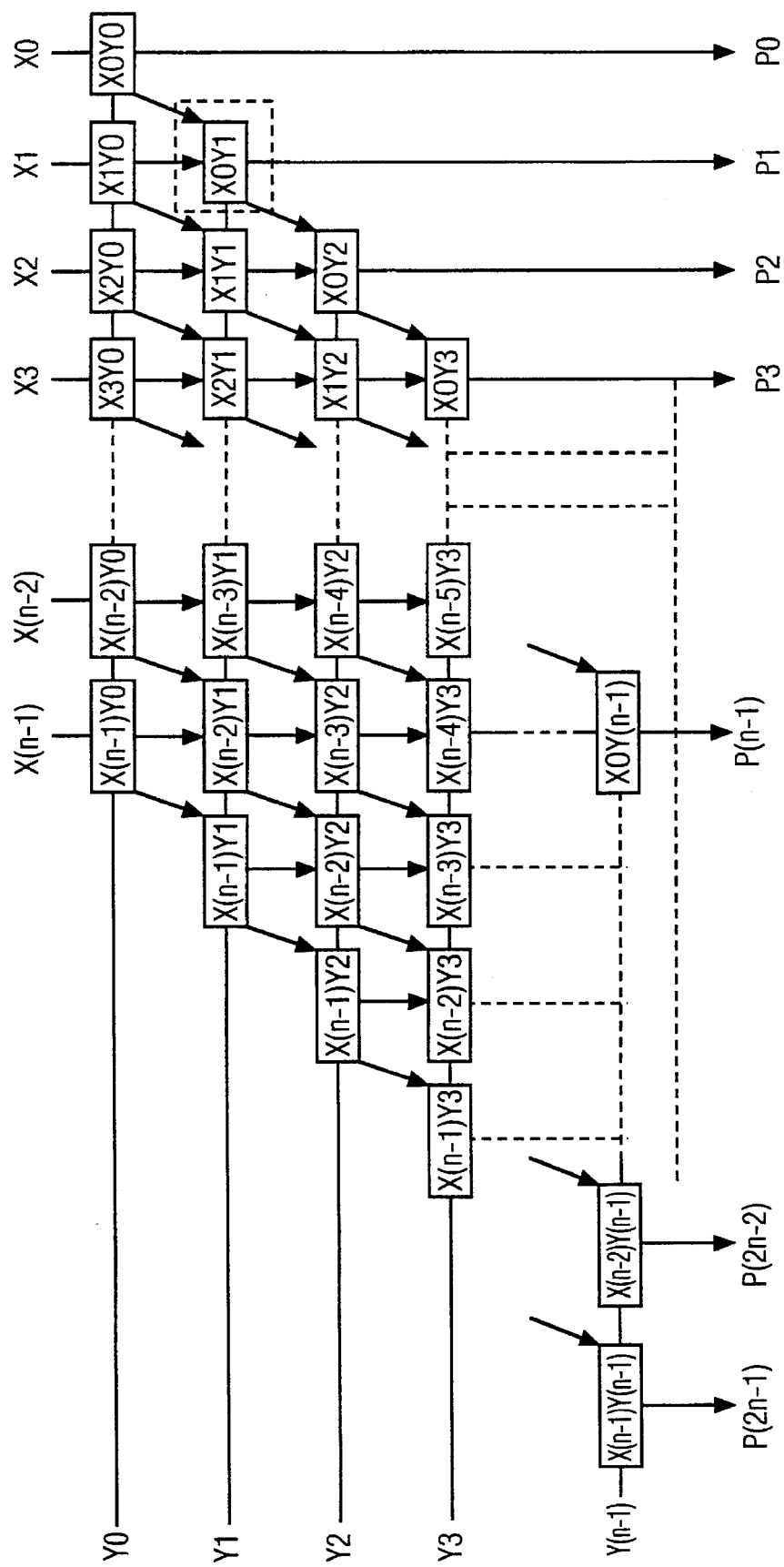
FIG. 1 shows a known n*n bit parallel multiplier.
Figure 2:
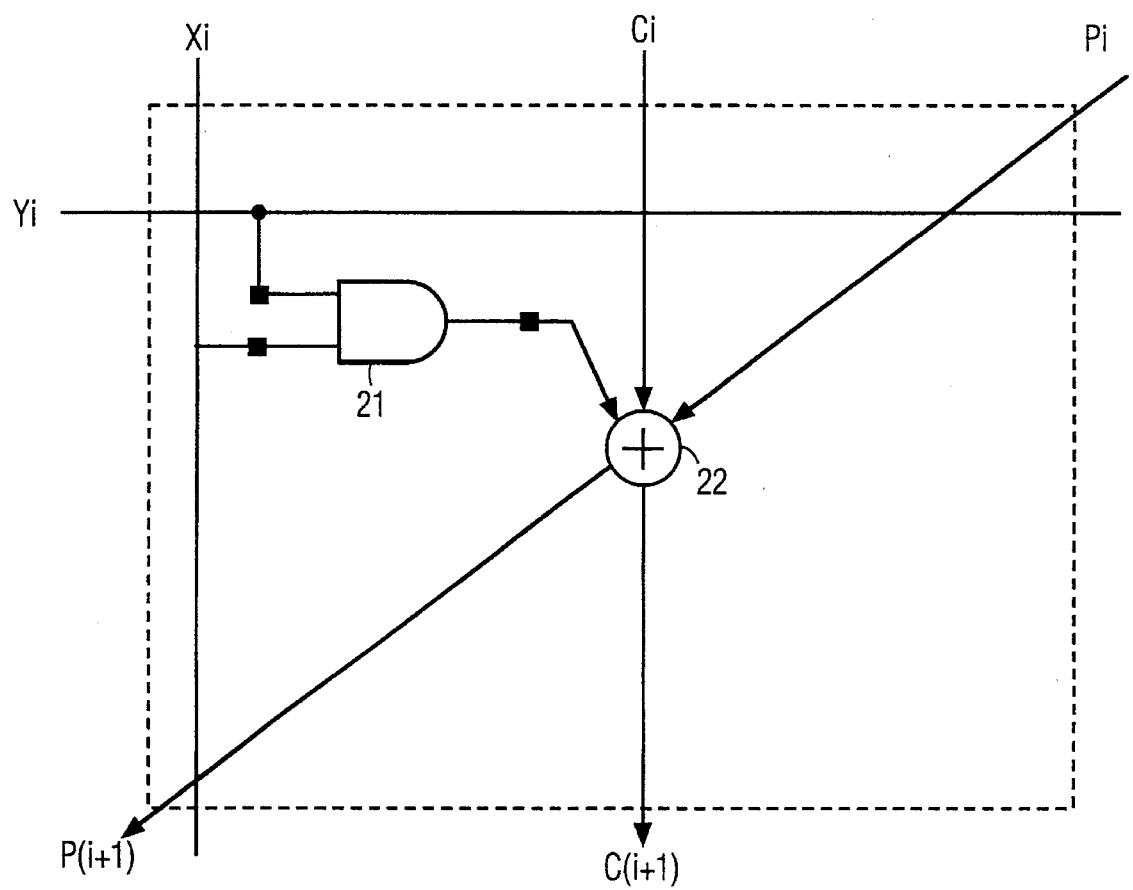
FIG. 2 shows an element in the partial product generator of the known multiplier.

For high speed multiplication the parallel scheme is chosen. The parallel multiplier is based on the fact that partial products in the multiplication process can be independently computed in parallel. FIG. 1 together with FIG. 2 show the classical implementation of an n*n bit parallel multiplier. It can be seen that n partial products are generated from the multiplicand (X(n−1), X(n−2), . . . , X1,X0) and the multiplicator (Y(n−1), Y(n−2), . . . , Y1,Y0) which are accumulated to the result (P(2n−1), P(2n−2), . . . , P1,P0). One element (marked with dashed lines in FIG. 1) is depicted in FIG. 2 with more detail. The respective bits Xi and Yi are combined in an AND gate 21 and added in a 1-bit full adder 22 to the respective carry bit Ci and to the respective partial product Pi, which leads to an output carry bit C(i+1) and to an output partial product P(i+1).

Figure 13:
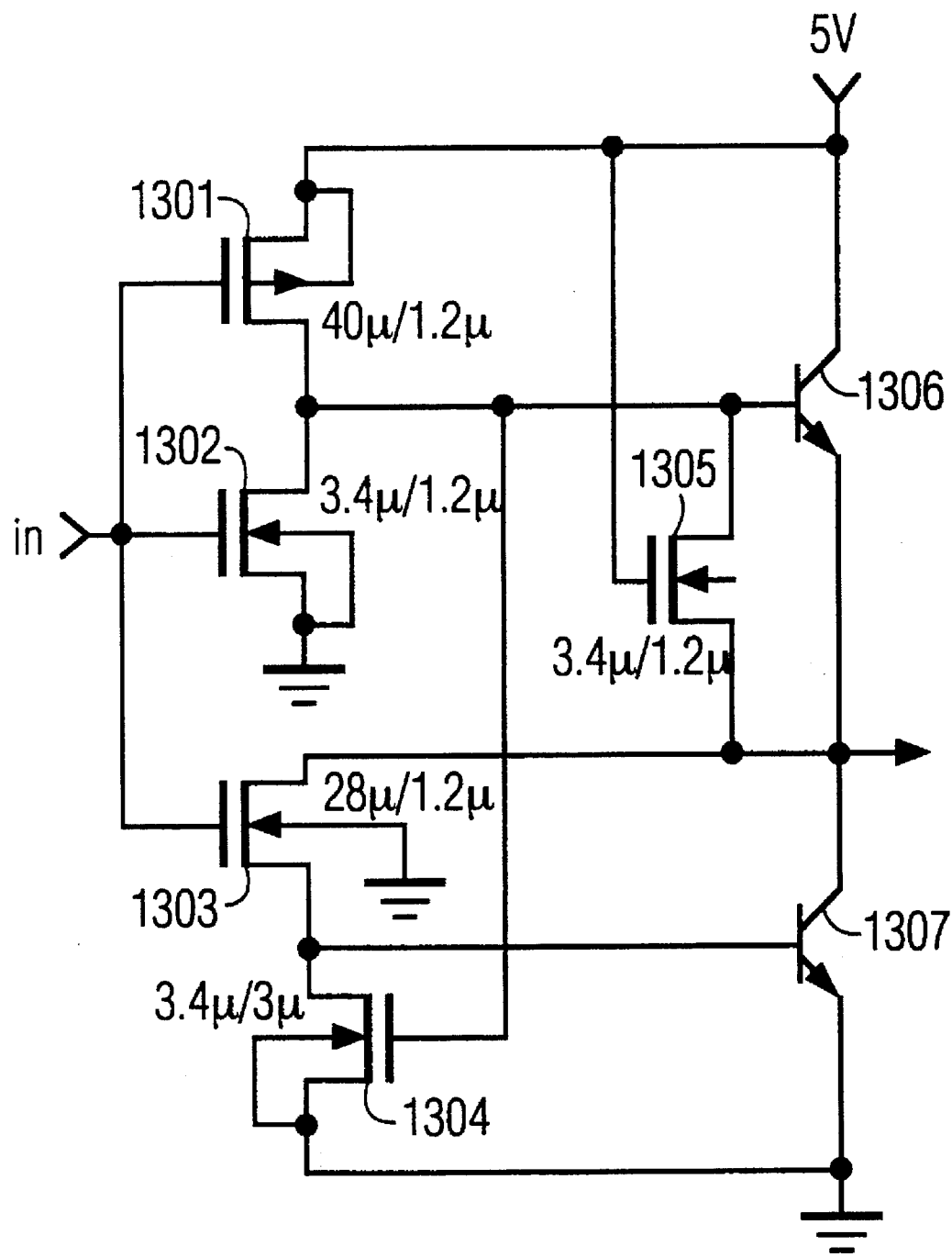
FIG. 13 shows a BICMOS buffer.

The inventive multiplier in nearly full CMOS design has been constructed with a 1.2μ BICMOS technology, having a multiplication time of 9 ns with a supply voltage of 5 volts. The inputs and outputs are in two's complement notation. BICMOS buffers as shown in FIG. 13 are used whenever the load is greater than 0.5 pF.

Minimum multiplication time has been achieved by a combination of the following techniques:

use of the Booth-Mc Sorley algorithm in order to reduce the number of partial products;

diagonal propagation of the carry from one partial product to the other allowing all the sums on one line to be done simultaneously;

use of the carry select approach in the final 14 bits adder and in the first two adders in the intermediate rows;

use of inventive fast 1-bit full adders with complementary pass transistor logic.

Figure 3:
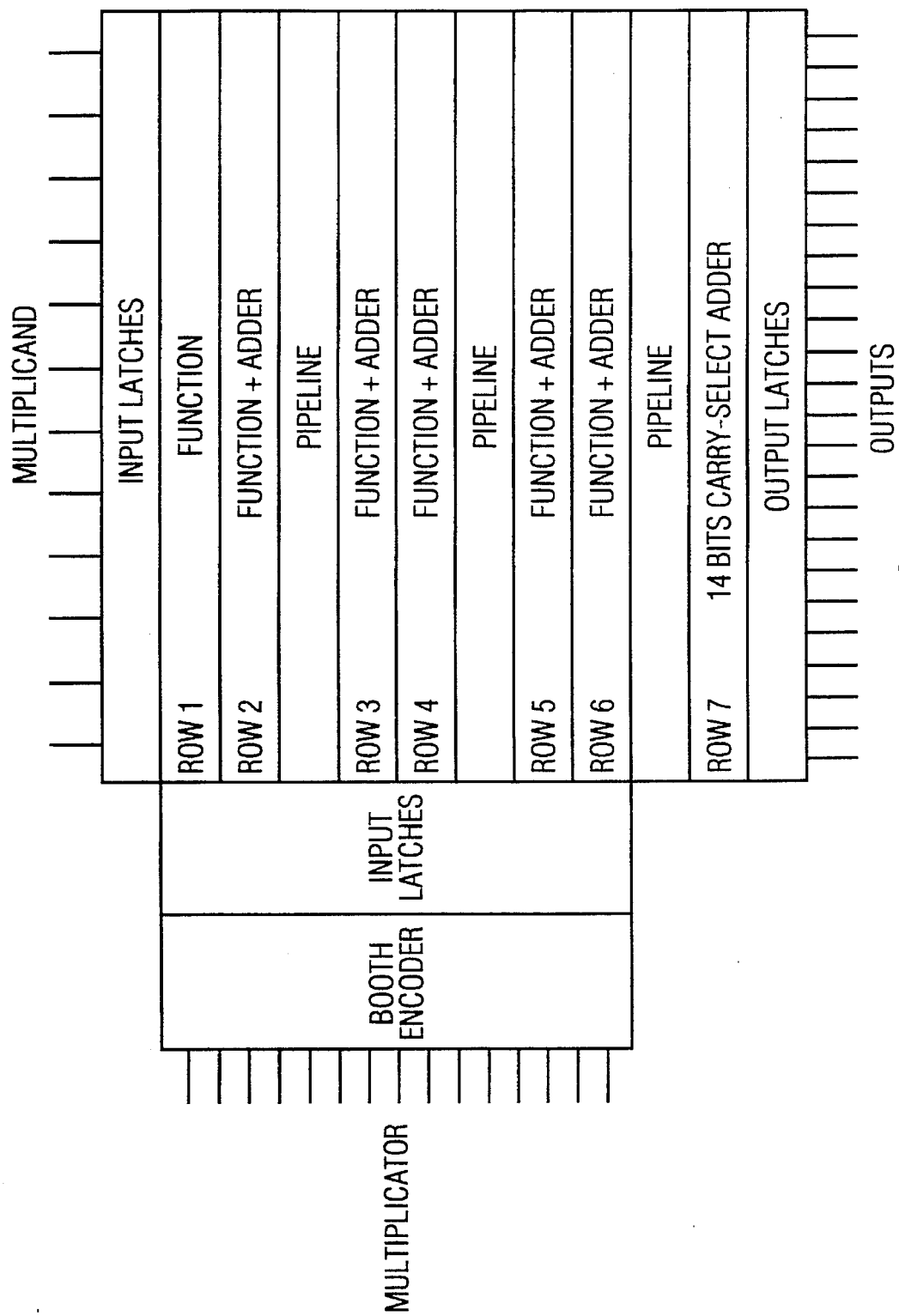
FIG. 3 shows an overall block diagram of the inventive multiplier.
Figure 4A:
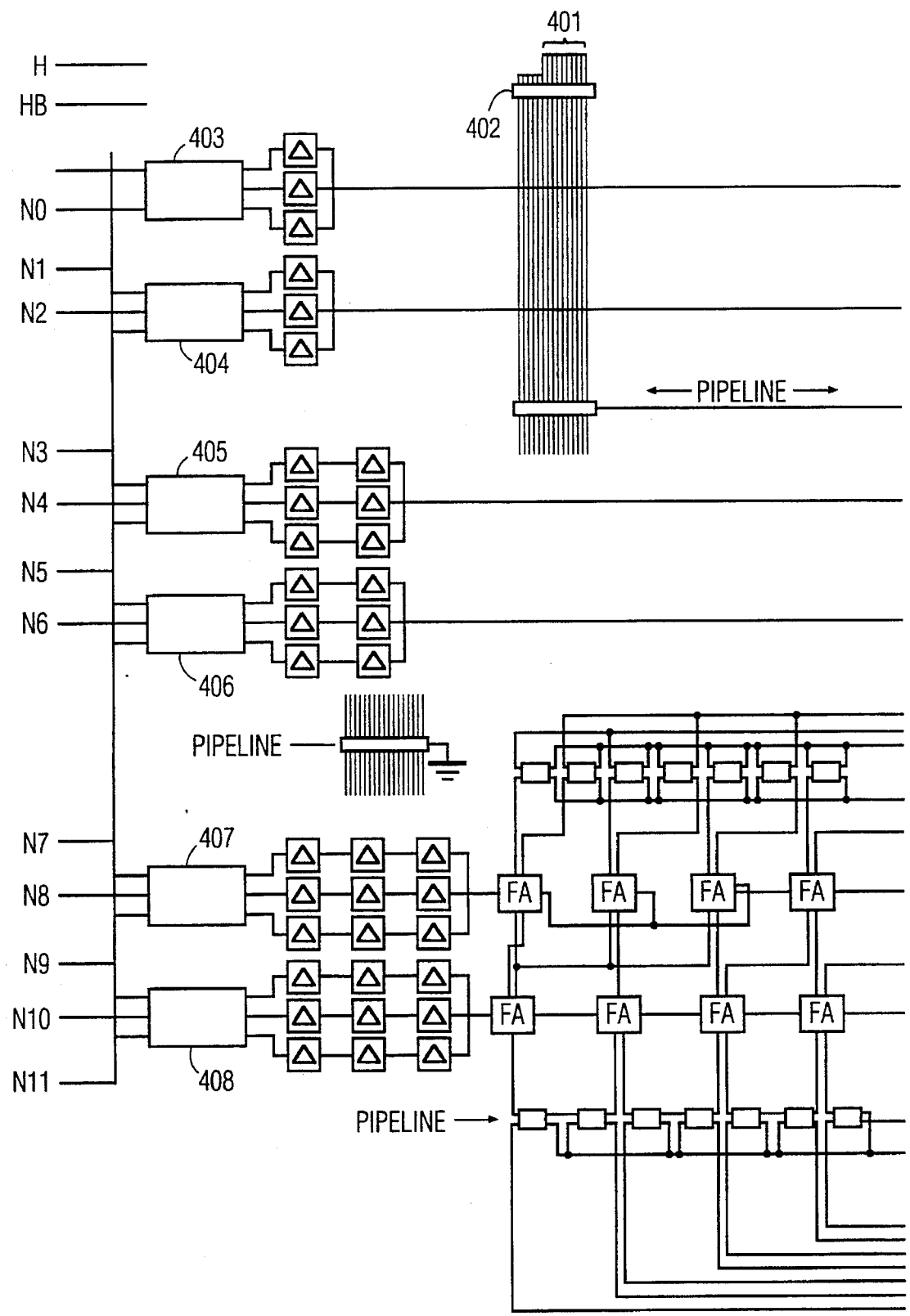
FIGS. 4a and 4b depict schematically the inventive multiplier circuit.
Figures 1, 4A:
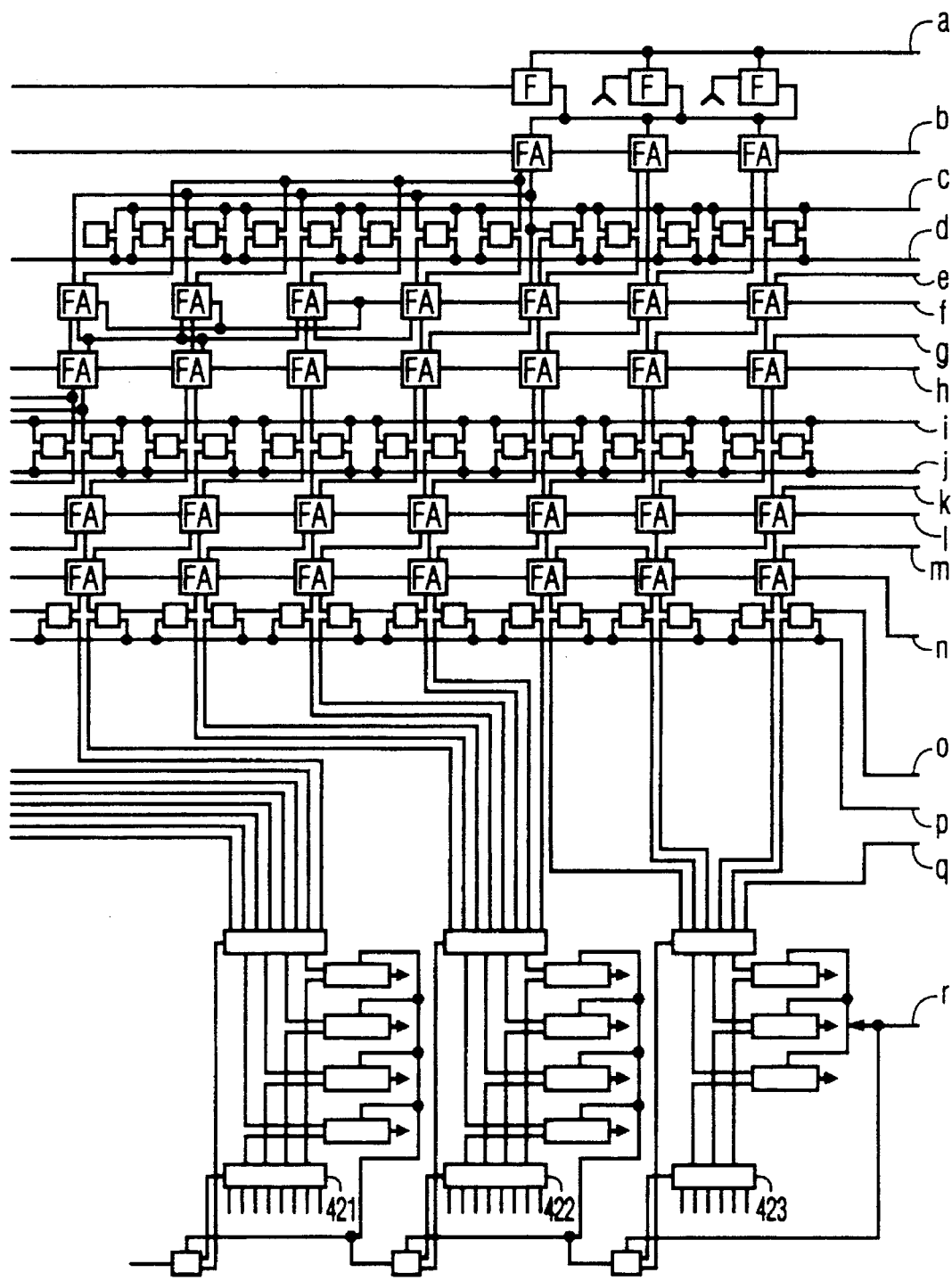
Figure 14:
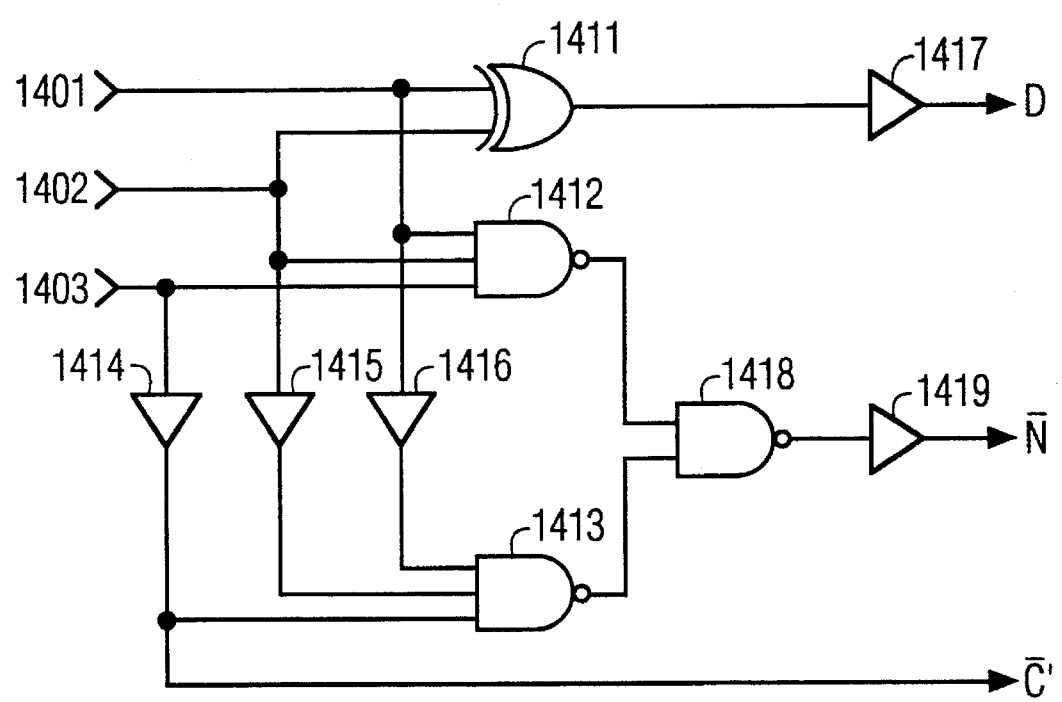
FIG. 14 depicts a Booth encoder circuit.

The multiplicand 401 in FIG. 4a and in FIG. 3 is fed to input latches 402. The multiplicator N0,N1, . . . , N10,N11 in FIG. 4a and in FIG. 3 is fed to Booth encoders 403–408. Such a Booth encoder circuit is depicted in FIG. 14. Each Booth encoder circuit has three inputs 1401, 1402 and 1403. Inputs 1401 and 1402 are fed via an XOR gate 1411 and an inverter 1417 to output D. All three inputs are fed via a first NAND gate 1412 to the first input of a third NAND gate 1418 and via three respective inverters 1414, 1415 and 1416 and a second NAND gate 1413 to the second input of the third NAND gate 1418. The output signal of third NAND gate 1418 becomes inverted in inverter 1419 and leads to output signal N (N is referred to as 'N inverted'). The output signal of inverter 1414, whose input is connected to input 1403, represents output signal C'.

The multiplicator N0,N1, . . . , N10,N11 is partitioned into 3-bit word substrings with adjacent groups sharing a common bit. The output signals of the Booth encoder circuit in FIG. 14 represent three command signals:

D-doubling or shift left;

C'-complementation;

N-zeroing.

Advantageously the inverted signals N and C' are used.

The Booth-Mc Sorley algorithm consists in efficiently processing strings of zeros or ones in the binary representation of the multiplicator in order to optimize the number of partial product sums. For a n-bits multiplicator in two's complement notation n/2 independent partial products are generated. Thus for a 12-bits multiplicator six partial products are obtained. Each multiplying step involves the sum of a precedent partial product and the modified (shift left, two's complementation or zeroing) multiplicand.

Figure 6:
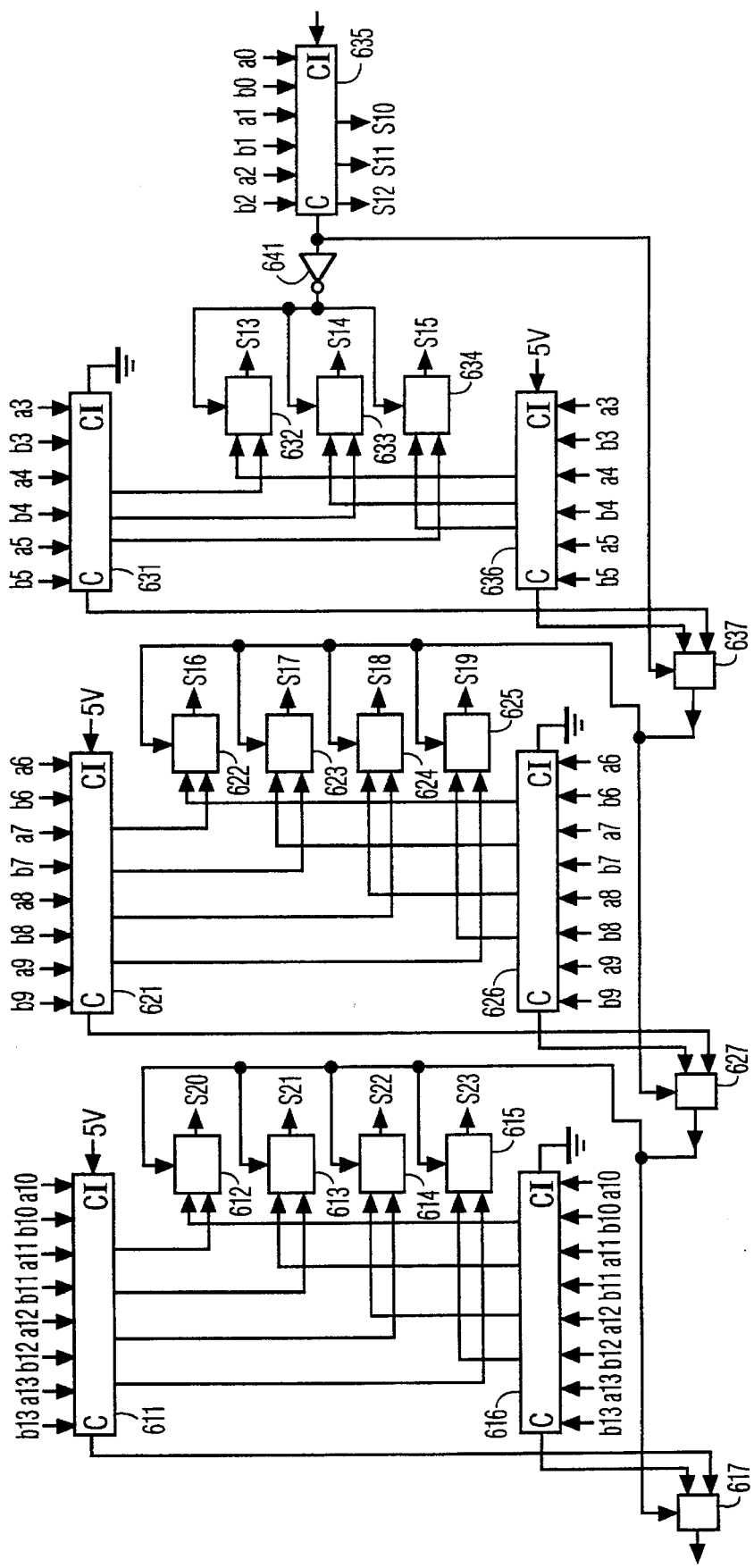
FIG. 6 shows a 14-bit carry select adder circuit.
Figure 10:
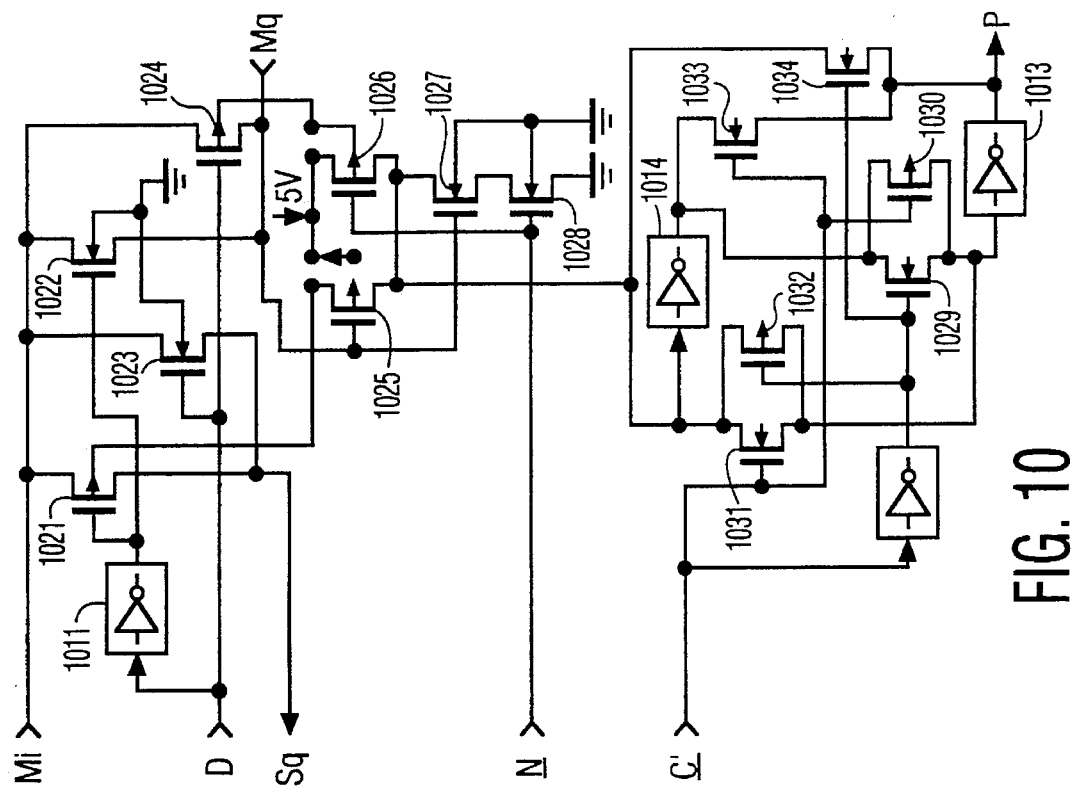
FIG. 10 depicts in detail the inventive function block of FIG. 9.
Figure 9:
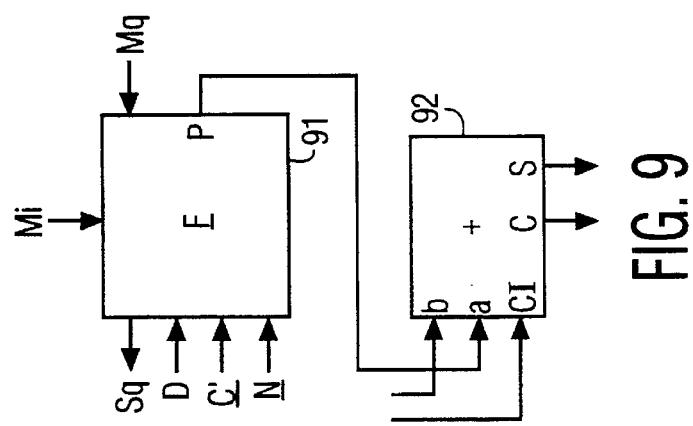
FIG. 9 shows a basic building block of the inventive multiplier for calculating according to the Booth-Mc Sorley algorithm.

The output signals of Booth encoders 403–408 are fed to static latches Δ. The inventive multiplier contains according to FIG. 3, FIG. 4a and FIG. 4b:

a first row 411 with function blocks F which are depicted in detail in FIG. 10;

a second row 412 with basic building blocks FA according to FIG. 9 which contain an inventive 1-bit full adder;

a first pipeline row a third row 414 with basic building blocks FA;

a fourth row 415 with basic building blocks FA;

a second pipeline row 416;

a fifth row 417 with basic building blocks FA;

a sixth row 418 with basic building blocks FA;

a third pipeline row 419;

a seventh row 410 with a 14-bits carry-select adder circuit which is shown in detail in FIG. 6.

The pipeline rows are constructed with latches. H and HB are clock signals. The blocks marked with '+' are also inventive 1-bit full adders. The blocks MUX are 2:1 multiplexers. The output signals S0 . . . S12 represent the lower twelve bits of the 24-bit result of the multiplication. The adder input signals 421, 422 and 423 are fed from respective inputs of the adders above within the seventh row 410. The multiplied input signals are available as 24-bit result at the output of latches (not depicted).

Figure 5:
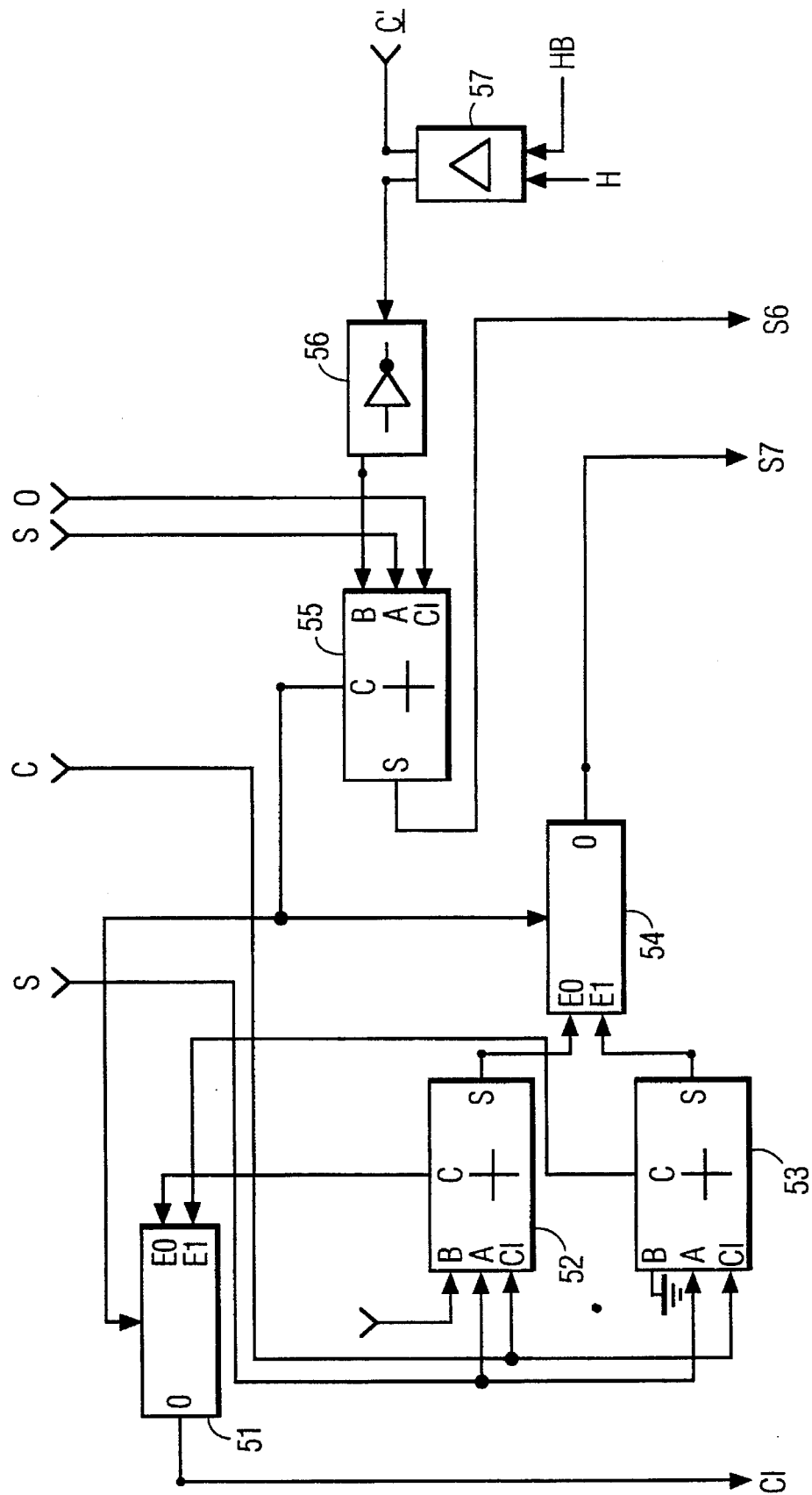
FIG. 5 shows in detail the first two adders in an intermediate row of the multiplier.

The lower bits in the third 414, fourth 415, fifth 417 and sixth 418 row are managed by adding circuits which are similar to adding circuit 430. This adding circuit is shown in detail in FIG. 5.

The inputs A of a first 1-bit full adder 52 and a second 1-bit full adder 53 are connected together and receive respective sum signals S from basic building blocks FA of the respective upper row. This is true, too, for the carry inputs CI which receive the carry output C from the basic building block above. The input B of first adder 52 is connected to supply voltage 5 V and the input B of second adder 53 to ground. The output sum signals S of both adders are connected to respective inputs E0 and E1 of a first 2:1 multiplexer 54 and the carry outputs C of both adders are connected to respective inputs E0 and E1 of a second 2:1 multiplexer 51. The switching inputs of both multiplexers are connected to the carry output C of a third 1-bit full adder 55. Input A of third adder 55 receives a respective sum signal S from a basic building block FA above of the respective upper row and the carry input CI is connected to the output O of a multiplexer in the respective upper row which has a respective function like second multiplexer 51. Input B of third adder 55 is connected to the output of an inverter 56. The input signal of this inverter is a latched complementation command signal C' which stems from a static latch 57 which receives the clock signals H and HB at its inputs. Output sum signal S of third adder 55 and output signal O of first multiplexer 54 form together with respective output signals of the other three adding circuits of FIG. 4b the multiplication result bits S0 . . . , S9.

Figure 4B:
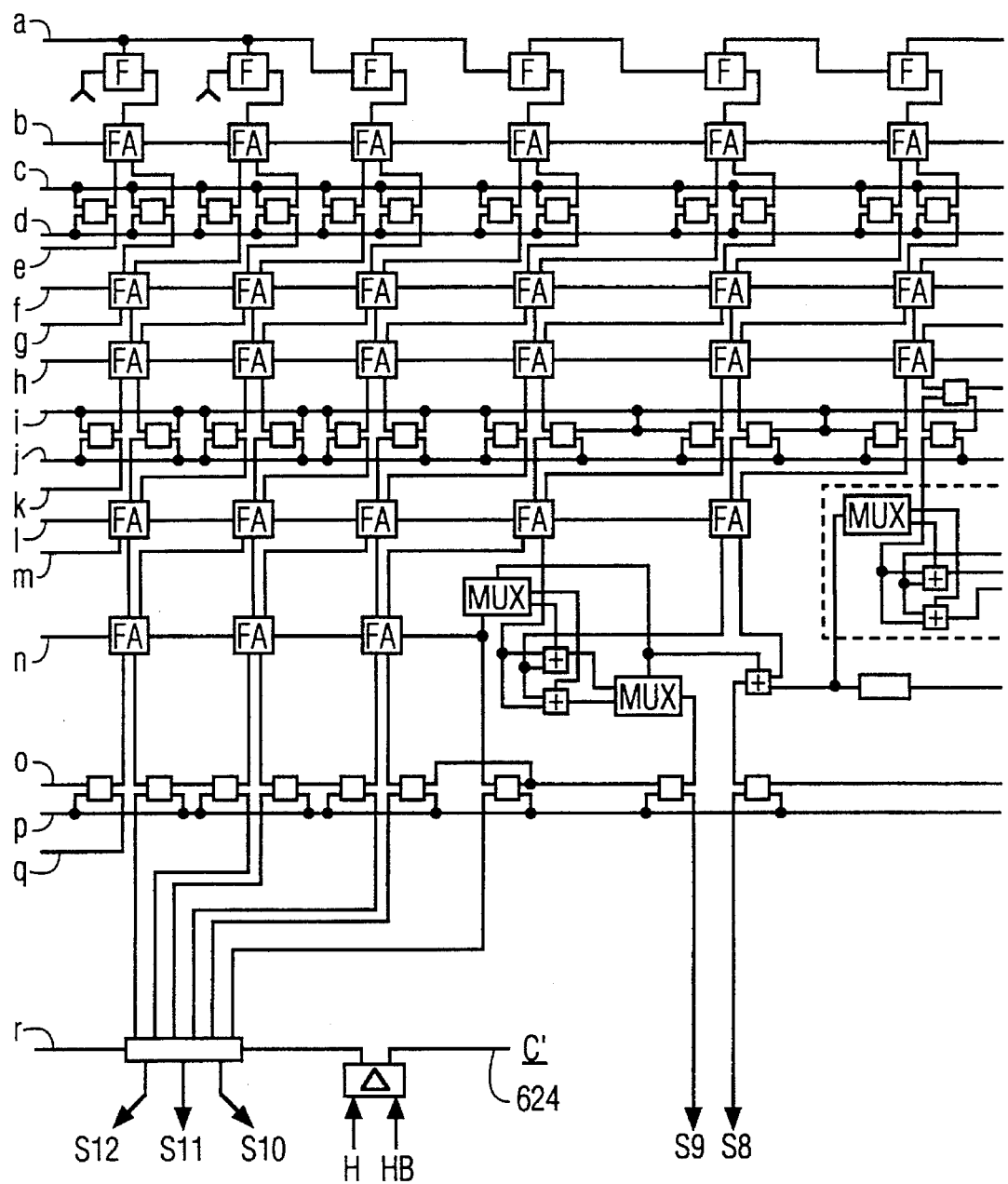
Figures 1, 4B:
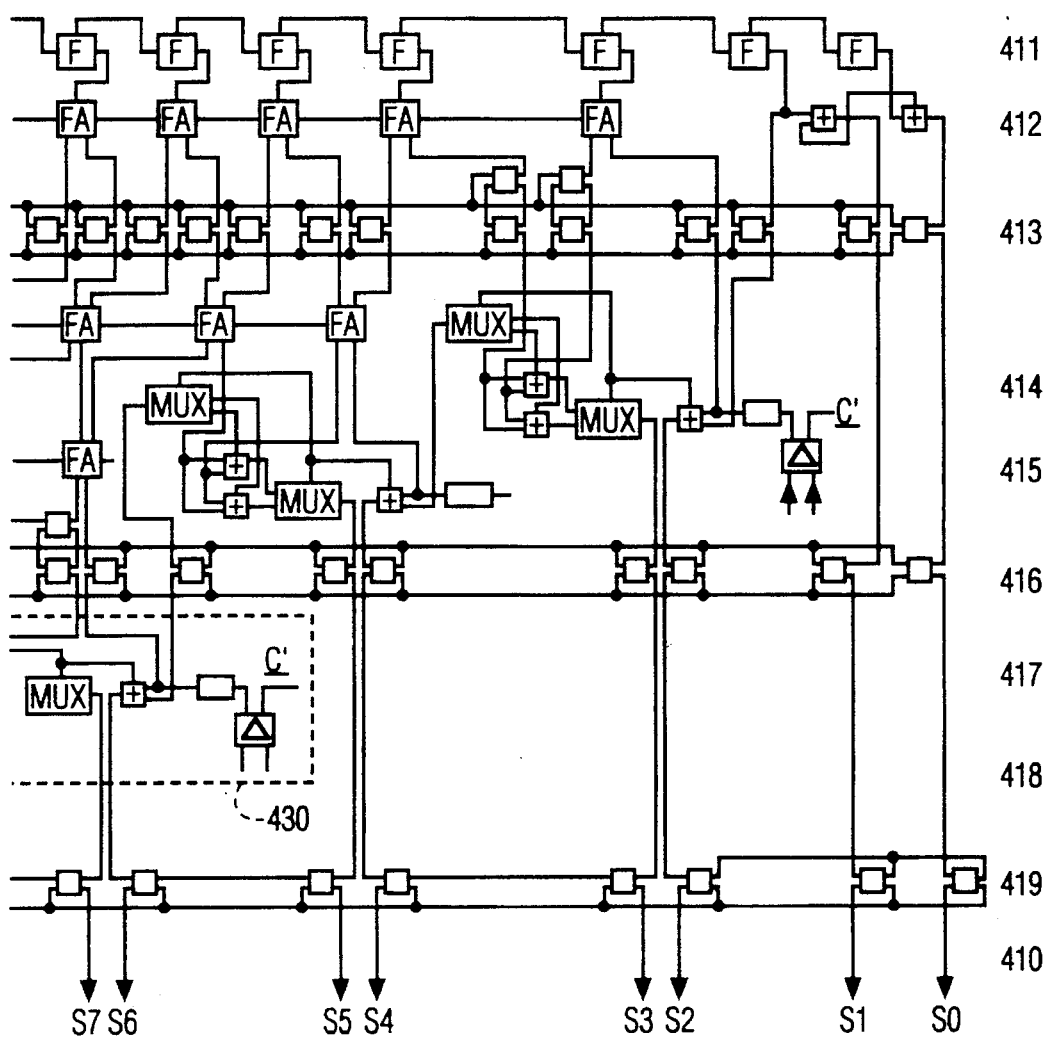

In FIG. 6 the 14-bits carry select adder circuit of the seventh row 410 of FIG. 4a and FIG. 4b contains 4-bit full adders 611, 621, 616 and 626, 3-bit full adders 631 and 636 with normal carry input, a 3-bit full adder 635 with complementary carry input and 2:1 multiplexers 612–615, 622–625, 632–634, 617, 627 and 637. The input signals a0, b0, a1, b1, a2 and b3 of adder 635 stem from the sum and carry outputs of the basic building blocks FA in sixth row 418 which follow directly the respective adding circuit. The input signals of adders 611, 616, 621, 626, 631 and 636 stem from the sum and carry outputs of the respective following basic building circuits of sixth row 418. The respective inputs a3, . . . , b13, e.g. a3 of adder 631 and a3 of adder 636, are connected together. The carry inputs CI of adders 616, 626 and 631 are connected to ground, i.e. logical '0', the carry inputs CI of adders 611, 621 and 636 are connected to supply voltage 5 V, i.e. logical '1'. The idea behind this parallel configuration of adders is to use fixed carry inputs and to select the one adder in case of CI='0' and the other, parallel adder in case of CI='1'. The respective (parallel) adder output is selected by 2:1 multiplexers 612–615, 622–625 and 632–634. The output signals of these multiplexers respectively represent output signals S20–S23, S16–S19 and S13–S15 of the upper bits of the 24-bit result of the multiplication. Carry input of adder 635 is connected to the one clock delayed complementation command signal C' generated in Booth encoder circuit 408 which has been latched in static latch 624. This latch is controlled by clock signals H and HB. The carry output of adder 635 is connected to an inverter 641 and to the switching input of multiplexer 637. The output of inverter 641 is connected to the switching inputs of multiplexers 632–634. The carry outputs C of adders 631 and 636 are connected to the inputs of 2:1 multiplexer 637. The output of this multiplexer is connected to the switching inputs of multiplexers 622–625 and to the switching input of multiplexer 627. The carry outputs C of adders 621 and 626 are connected to the inputs of 2:1 multiplexer 627. The output of this multiplexer is connected to the switching inputs of multiplexers 612–615 and to the switching input of multiplexer 617. The carry outputs C of adders 611 and 616 are connected to the inputs of 2:1 multiplexer 617. The output of this multiplexer represents an overflow signal.

The operations of the adders are done quasi-simultaneously. This results in a maximum propagation delay $\tau_m$ for the 14-bit carry select adder circuit equal to $$\tau_m = \tau_3 + 3 * \tau_{mx};$$

$\tau_3$=propagation delay for the carry output of adders 631 or 636

$\tau_{mx}$=propagation delay of a multiplexer.

The adders 611, 621, 616, 626, 631, 636 and 635 internally also make use of the carry select technique in order to have minimum propagation delay.

Figure 7:
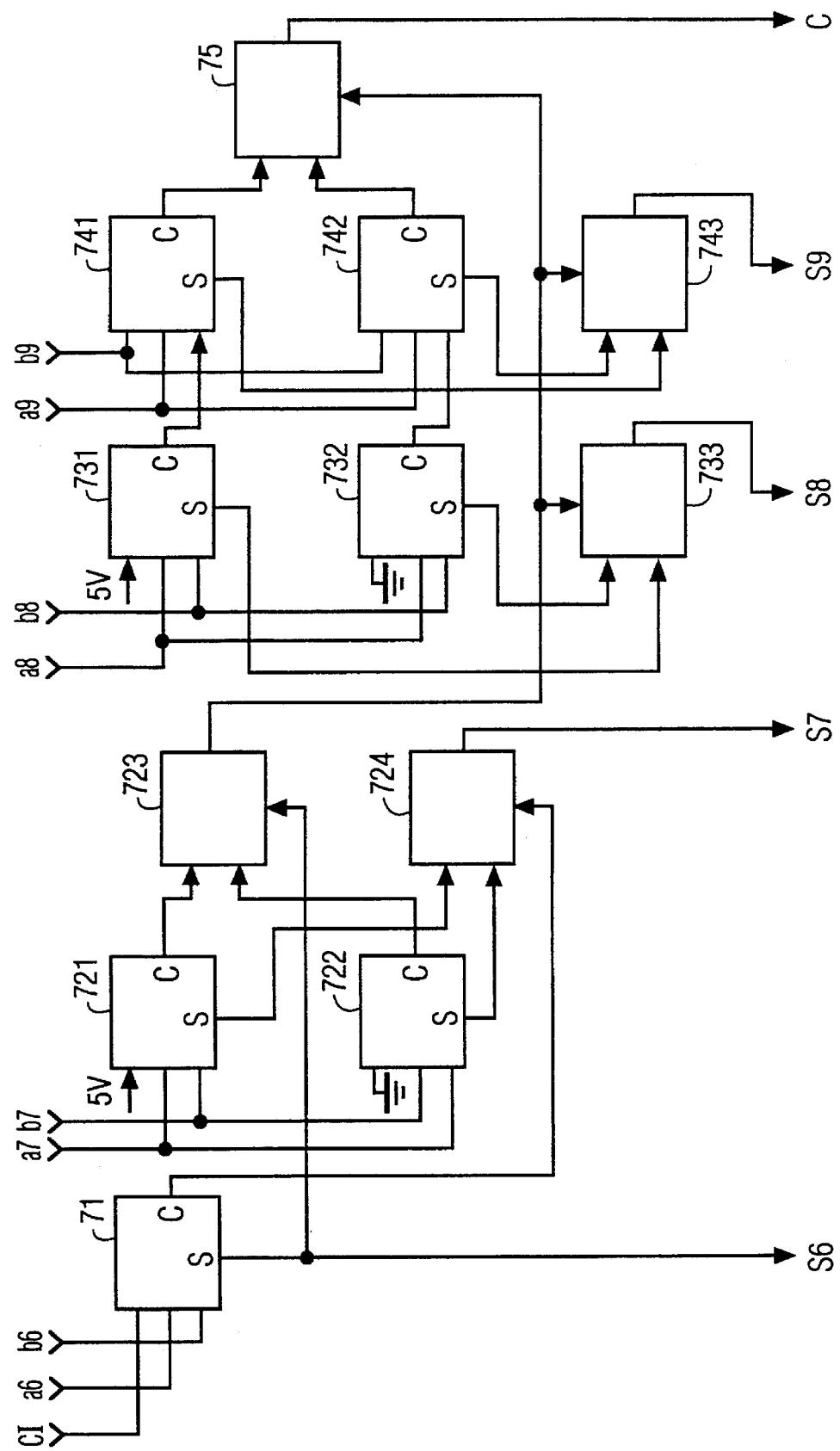
FIG. 7 shows a 4-bit full adder.

The 4-bit full adders 611, 621, 616 and 626 are depicted in FIG. 7 in more detail and contain second version 1-bit full adders 71, 721, 722, 731 and 732, third version 1-bit full adders 741 and 742, and 2:1 multiplexers 723, 724, 733, 743 and 75. E.g. the input signals a6–a9 and b6–b9 for adder 621 are fed to respective connected parallel 1-bit adders. Input signals a6 and b6 and carry input CI are fed to adder 71 which outputs the sum signal S, representing bit S6 of the multiplication result. The carry output C is connected to the switching input of multiplexers 723 and 724. The carry input of adders 721 and 731 is connected to logical '1' and the carry input of adders 722 and 732 to logical '0'. Input signals a7 and b7 are fed to adders 721 and 722, input signals a8 and b8 to adders 731 and 732 and input signals a9 and b9 to adders 741 and 742. The sum outputs S of adders 721 and 722 are connected to inputs of multiplexer 724 and the carry outputs C to inputs of multiplexer 723. At the output of multiplexer 724 the sum signal $7 is available. The output of multiplexer 723 is connected to the switching input of multiplexers 733, 743 and 75. The sum outputs S of adders 731 and 732 are connected to inputs of multiplexer 733. At the output of multiplexer 733 the sum signal S8 is available. Carry output C of adder 731 is connected to the carry input of adder 741 and carry output C of adder 732 to the carry input of adder 742. The sum outputs S of adders 741 and 742 are connected to inputs of multiplexer 743 and the carry outputs C to inputs of multiplexer 75. At the output of multiplexer 743 the sum signal S9 is available and at the output of multiplexer 75 the carry signal C.

Figure 8:
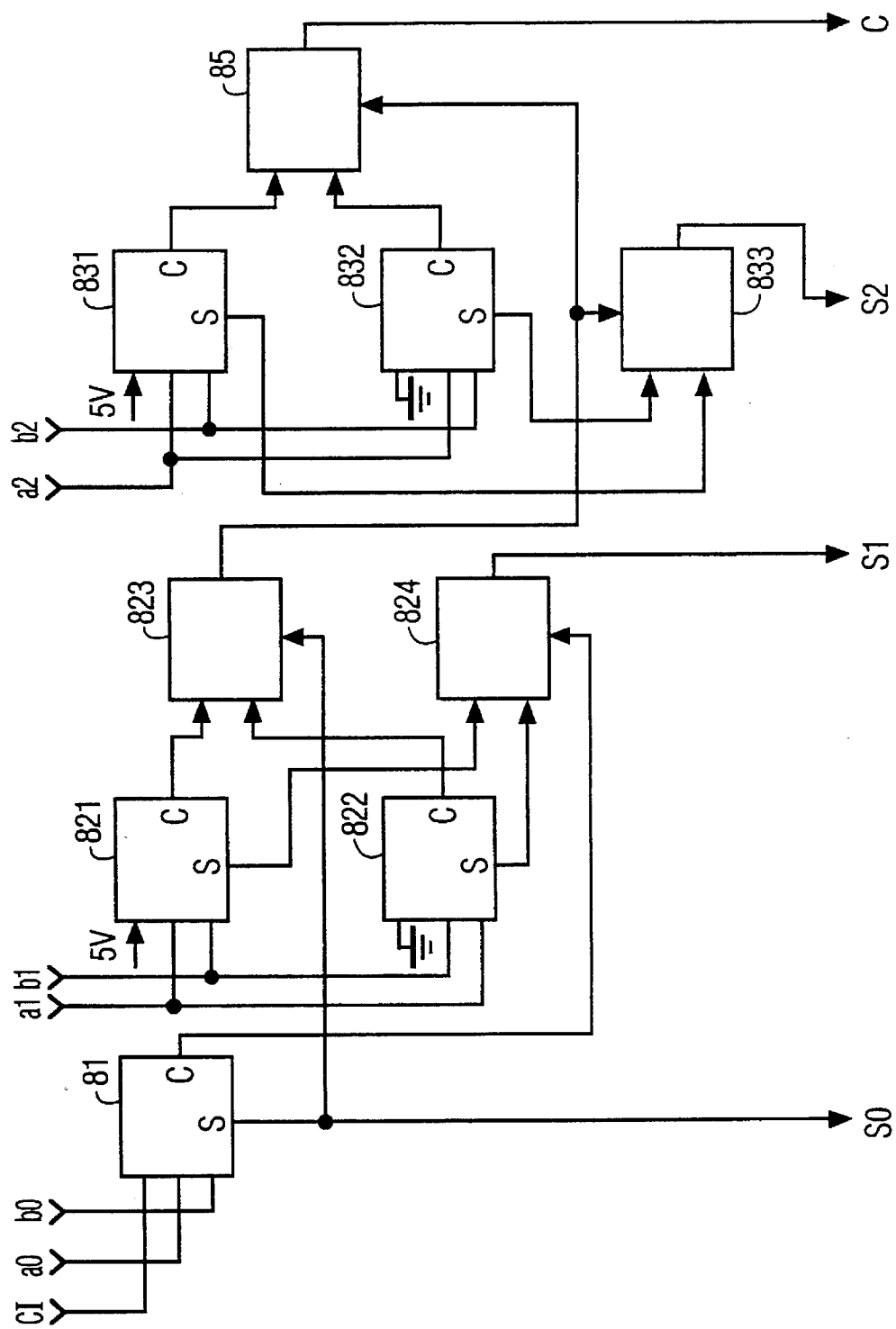
FIG. 8 shows a 3-bit full adder with normal or complementary carry input.

The 3-bit full adders 631, 636 and 635 are depicted in FIG. 8 in more detail and contain second version 1-bit full adders 821, 822, 831 and 832 and 2:1 multiplexers 823, 824, 833 and 85. If adder 81 is a second version 1-bit full adder according to FIG. 11 the 3-bit adder has a normal carry input and if adder 81 is a third version 1-bit full adder according to FIG. 12 the 3-bit adder has a complementary carry input CI.

E.g. the input signals a0–a2 and b0–b2 for adder 635 are fed to respective connected parallel 1-bit adders. Input signals a0 and b0 and carry input CI are fed to adder 81 which outputs the sum signal S, representing bit S0 of the multiplication result. The carry output C is connected to the switching input of multiplexers 823 and 824. The carry input of adders 821 and 831 is connected to logical '1' and the carry input of adders 822 and 832 to logical '0'. The sum outputs S of adders 821 and 822 are connected to inputs of multiplexer 824 and the carry outputs C to inputs of multiplexer 823. At the output of multiplexer 824 the sum signal S1 is available. The output of multiplexer 823 is connected to the switching input of multiplexers 833 and 85. The sum outputs S of adders 831 and 832 are connected to inputs of multiplexer 833. At the output of multiplexer 833 the sum signal S2 is available. The carry outputs C of adders 831 and 832 are connected to inputs of multiplexer 85. At the output of multiplexer 85 the carry signal C is available.

The basic building blocks FA in FIG. 4a and FIG. 4b contain a function block F, 91 according to FIG. 9 and an inventive first version 1-bit full adder 92. Function block 91 multiplies the Booth encoded substrings. It receives signals D (shift left), C' (complementation) and N (zeroing) generated in the respective Booth encoder circuits, Mi (multiplicand corresponding to one of the 12 muttiplicand bits (X(n−1), X(n−2), . . . , X1,X0)) and Mq (corresponding to a 'multiply by 2' output Sq in the previous right function block). Output Sq controls the Mq input of the next left function block. The output product P is connected to input 'a' of adder 92. Input 'b' of adder 92 is connected to the upper right basic building or function block of the above row and carry input CI to the upper basic building or function block above in the above row.

Sum signal S of adder 92 is fed to the lower basic building block or adding circuit of the row below and carry output C to the left lower basic building block or adding circuit of the row below.

The detailed circuitry of function block F, 91 is given in FIG. 10. All MOS transistors are constructed in 1.2μ technology. All NMOS transistors have their bulk connected to the most negative potential (VSS, ground) and all PMOS transistors have their bulk connected to the most positive potential (VDD, 5 V).

The source of PMOS transistors 1021 and 1024 and the drain of NMOS transistors 1022 and 1023 is connected to signal Mi. Input signal D is fed directly to the gate of transistors 1023 and 1024 and via inverter 1011 to the gate of transistors 1021 and 1022.

Signal Mq is fed to the drain of transistor 1024, source of transistor 1022, gate of PMOS transistor 1025 and gate of NMOS transistor 1027.

Signal Sq is connected to the drain of transistor 1021 and to the source of transistor 1023.

The source of PMOS transistors 1025 and 1026 is connected to supply voltage 5 V. The drain of these transistors is connected together and to the drain of NMOS transistor 1027, to the input of inverter 1014, to the drain of NMOS transistors 1031 and 1034 and to the source of PMOS transistor 1032. The source of transistor 1027 is connected to the drain of NMOS transistor 1028 which has its source connected to ground. Input signal N is fed to the gate of transistors 1026 and 1028.

Input signal C' is connected directly to the gate of transistor 1031 and PMOS transistor 1030 and NMOS transistor 1033 and is connected via inverter 1012 to the gate of transistors 1032 and 1034 and NMOS transistor 1029. The source of transistors 1031 and 1029 and the drain of transistors 1032 and 1030 and the input of inverter 1013 are connected together. The output of inverter 1014 is connected to the drain of transistors 1033 and 1029 and to the source of transistor 1030.

The output P is connected to the output of inverter 1013 and to the source of transistors 1033 and 1034. Transistors 1033 and 1034 are NMOS switches. Transistor pairs 1021/1023 and 1022/1024 and 1031/1032 and 1029/1030 represent complementary analogue CMOS switches. They allow full supply voltage output swing amplitude. By using such switches in connection with an inverter, e.g. inverter 1013 and transistors 1029, 1030, 1033 and 1034, advantageously the earliest output slope of these transistors is taken for generating the output signal P. This feature, too, helps to speed up the inventive multiplier.

Figure 11:
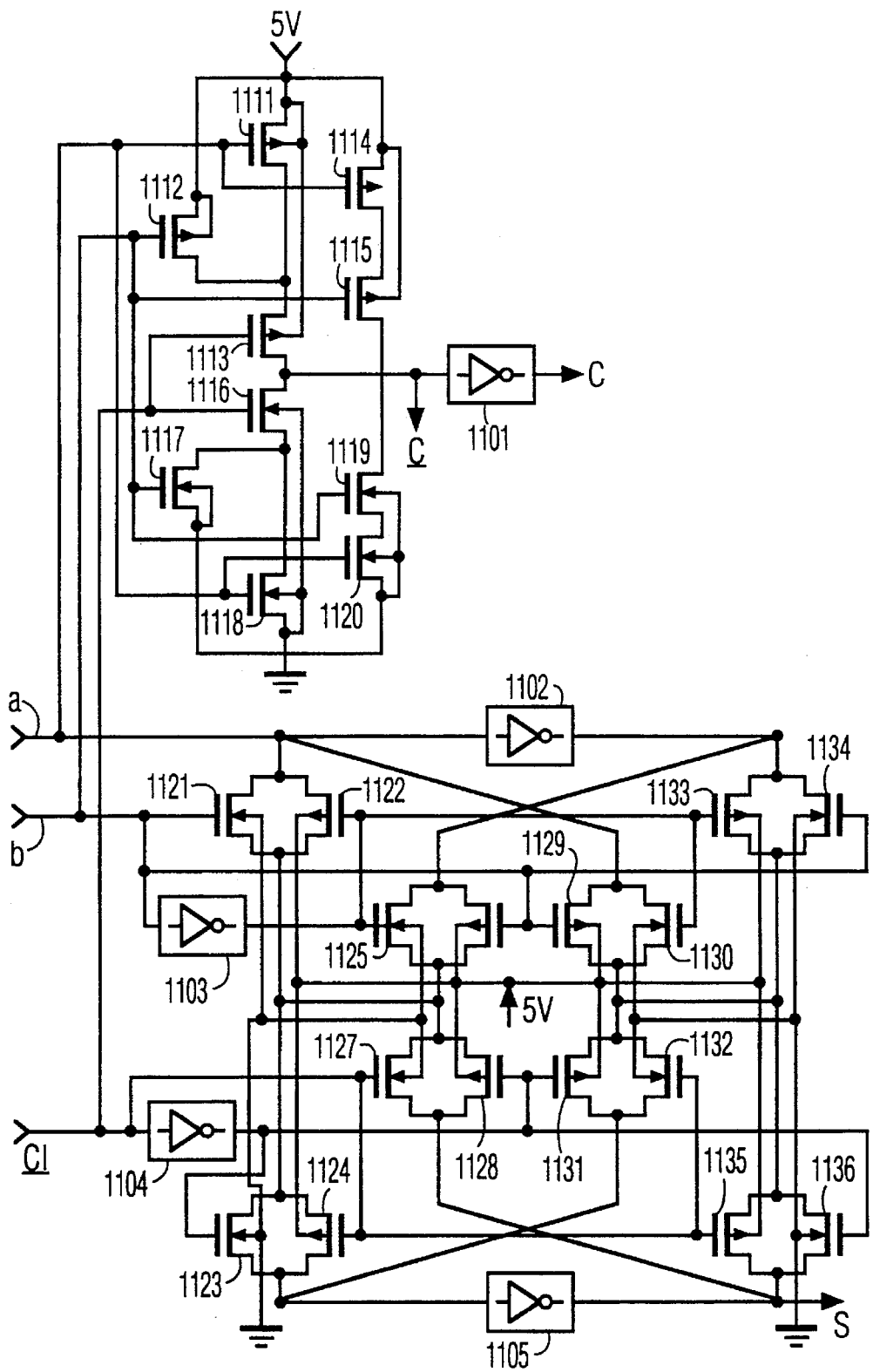
FIG. 11 shows a first and a second embodiment of the inventive 1-bit full adder.
Figure 12:
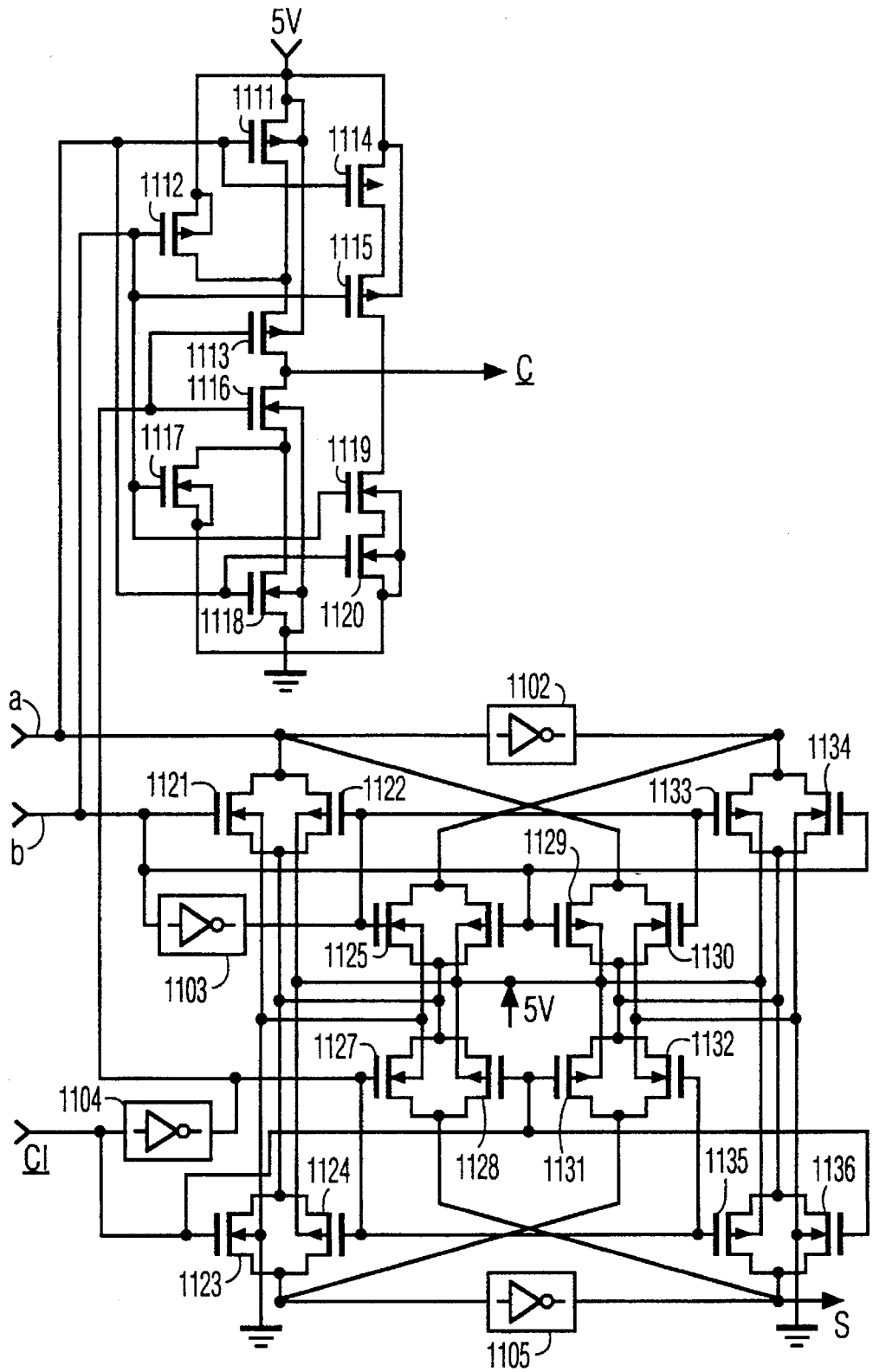
FIG. 12 shows a third embodiment of the inventive 1-bit full adder.

The first and second version of the inventive 1-bit full adder in FIG. 11 and the third version in FIG. 12 also use complementary analogue CMOS switches. These circuits consist of an adding stage in the lower half and a carry stage in the upper half.

All NMOS transistors have their bulk connected to the most negative potential (VSS, ground) and all PMOS transistors have their bulk connected to the most positive potential (VDD, 5 V). Transistors 1111, 1112, 1113, 1114, 1115, 1122, 1124, 1126, 1128, 1129, 1131, 1133 and 1135 are of PMOS type. Transistors 1116, 1117, 1118, 1119, 1120, 1121, 1123, 1125, 1127, 1130, 1132, 1134 and 1136 are of NMOS type. Transistor pairs 1121/1122, 1123/1124, 1125/1126, 1127/1128, 1129/1130, 1131/1132, 1133/1134 and 1135/1136 represent complementary analogue CMOS switches which have source PMOS/drain NMOS connected together and source NMOS/drain PMOS connected together.

Input 'a' is connected to the input of inverter 1102, to the drain of transistors 1121 and 1130, to the gate of transistors 1111, 1114, 1118 and 1120. Input 'b' is connected to the input of inverter 1103 and to the gate of transistors 1112, 1115, 1117, 1119, 1121, 1134, 1126 and 1129. Carry input CI is connected to the input of inverter 1104 and to the gate of transistors 1113, 1116, 1127, 1124, 1135 and 1132.

Carry output C is connected in the first version adder to the output of inverter 1101. In the second version adder the inverted carry output C is connected to the drain of transistors 1116, 1119, 1113 and 1115.

Sum output S is connected to the output of inverter 1105 and to the source of transistors 1127 and 1136.

In the carry stage, the source of transistors 1111, 1112 and 1114 is connected to supply voltage 5 V and the source of transistors 1117, 1118 and 1120 to ground.

The drain of transistors 1112 and 1111 is connected to the source of transistor 1113. The drain of transistor 1114 is connected to the source of transistor 1115.

The drain of transistors 1117 and 1118 is connected to the source of transistor 1116. The drain of transistor 1120 is connected to the source of transistor 1119.

In the first version adder the drain of transistors 1116, 1119, 1113 and 1115 is connected to the input of inverter 1101.

In the adding stage, the output of inverter 1102 is connected to the drain of transistors 1125 and 1134 and the input of inverter 1105 is connected to the source of transistors 1123 and 1132.

The output of inverter 1103 is connected to the gate of transistors 1122, 1125, 1130 and 1133 and the output of inverter 1104 to the gate of transistors 1123, 1128, 1131 and 1136. The source of transistors 1121, 1124, 1125 and 1128 is connected together and the source of transistors 1134, 1135, 1130 and 1131 is connected together.

By using the switches constructed with the complementary transistor pairs 1123/1124 and 1135/1136 in connection with inverter 1105, advantageously the earliest output slope of these both transistor pairs is taken for generating the output sum signal S.

Within the third version adder in FIG. 12 instead of carry input signal CI the inverted carry input signal CI is connected to the input of inverter 1104, to the gate of transistors 1123, 1136, 1128 and 1131. The output of inverter 1104 is connected to the gate of transistors 1113, 1116, 1127, 1124, 1135 and 1132. The inverted carry output C is connected as in the second version adder.

In the BICMOS buffer in FIG. 13 the input signal 'in' is fed to the gate of PMOS transistor 1301 and of NMOS transistors 1302 and 1303. The source and the bulk of transistor 1301, the gate of NMOS transistor 1305 and the collector of NPN transistor 1306 are connected to supply voltage 5 V. The drain of transistor 1301 is connected to the drain of transistors 1302 and 1305, to the gate of NMOS transistor 1304 and to the base of transistor 1306. Bulk and source of transistors 1302 and 1304, bulk of transistor 1303 and emitter of NPN transistor 1307 are connected to ground. The source of transistor 1303 is connected to the drain of transistor 1304 and to the base of transistor 1307. The output signal 'out' is connected to the drain of transistor 1303, to the source of transistor 1305, to the emitter of transistor 1306 and to the collector of transistor 1307.

Such BICMOS buffers are located at the outputs of the static latches after the Booth encoder circuits 403–408 and at the outputs of the pipeline in row 419. Such buffers can also be used at the multiplier outputs. The inverters in FIG. 10, FIG. 11 and FIG. 12 can also be such BICMOS buffers or standard CMOS buffers.

The inventive multiplier can be used for video applications, e.g. γ-correction, linearization, weighting.

I claim:

1. A one-bit adder comprising a carry stage and an adding stage, wherein:

said adding stage of said adder is constructed in a fast CMOS complementary pass transistor logic with complementary analogue CMOS switches which consist of a PMOS and a NMOS transistor; wherein the source of said PMOS transistor is connected with the drain of said NMOS transistor and the drain of said PMOS transistor is connected with the source of said NMOS transistor;

the gate of said PMOS transistor receives inverted signals with respect to the gate of said NMOS transistor: and wherein two partial output sum signals are generated by two of said switches which are connected with the input and with the output, respectively, of an inverter and wherein an output sum signal of said adder is available at the output of said inverter (1105).

2. An adder according to claim 1, wherein:

all NMOS transistors have their bulk connected to the most negative potential and all PMOS transistors have their bulk connected to the most positive potential;

transistors T1111, T1112, T1113, T1114, T1115, T1122, T1124, T1126, T1128, T1129, T1131, T1133, and T1135 are of PMOS type and transistors T1116, T1117, T1118, T1119, T1120, T1121, T1123, T1125, T1127, T1130, T1132, T1134 and T1136 are of NMOS type;

transistor pairs T1121/T1122, T1123/T1124, T1125/T1126, T1127/T1128, T1129/T1130, T1131/T1132, T1133/T1134 and T1135/T1136 represent said switches;

a first summing input is connected to the input of an inverter I1102, to the drain of transistors T1121 and T1130 and to the gate of transistors T1111, T1114, T1118 and T1120;

a second summing input is connected to the input of an inverter I1103, and to the gate of transistors T1112, T1115, T1117, T1119, T1121, T1134, T1126, and T1129;

an inverted carry input is connected to the input of an inverter I1104 and to the gate of transistors T1113, T1116, T1127, T1124, T1135 and T1132;

a sum output is connected to the output of said inverter I1105 and to the source of transistors T1127 and T1136;

the source of transistors T1111, T1112 and T1114 is connected to the most positive potential and the source of transistors T1117, T1118, and T1120 to the most negative potential;

the drains of transistors T1112 and T1111 are connected to the source of transistor T1113 and the drain of transistor T1114 is connected to the source of transistor T1115 and the drains of transistors T1117 and T1118 are connected to the source of transistor T1116 and the drain of transistor T1120 is connected to the source of transistor T1119;

the drains of transistors T1116, T1119, T1113 and T1115 are connected together to form an inverted carry output;

the output of inverter I1102 is connected to the drain of transistors T1125 and T1134 and the input of inverter T1105 is connected to the source of transistors T1123 and T1132;

the output of inverter I1103 is connected to the gate of transistors T1122, T1125, T1130 and T1133 and the output of inverter I1104 to the gate of transistors T1123, T1128, T1131 and T1136; and the source of transistors T1121, T1124, T1125 and T1128 are connected together and the source of transistors T1134, T1135 T1130 and T1131 are connected together.

3. An adder according to claim 1, wherein:

all NMOS transistors have their bulk functionally connected to the most negative potential and all PMOS transistors have their bulk functionally connected to the most positive potential;

transistors T1111, T1112, T1113, T1114, T1115, T1122, T1124, T1126, T1128, T1129, T1131, T1133, and T1135 are of PMOS type and transistors T1116, T1117, T1118, T1119, T1120, T1121, T1123, T1125, T1127, T1130, T1132, T1134 and T1136 are of NMOS type;

transistor pairs T1121/T1122, T1123/T1124, T1125/T1126, T1127/T1128, T1129/T1130, T1131/T1132, T1133/T1134 and T1135/T1136 represent said switches;

a first summing input is functionally connected to the input of an inverter I1102, to the drain of transistors T1121 and T1130 and to the gate of transistors T1111, T1114, T1118 and T1120;

a second summing input is functionally connected to the input of an inverter I1103, and to the gates of transistors T1112 and T1115, T1117, T1119, T1121, T1134, T1126, and T1129;

an inverted carry input is functionally connected to the input of an inverter I1104 and to the gate of transistors T1123, T1128, T1127, T1131 and T1136;

the drains of transistors T1116, T1119, T1113 and T1115 are functionally connected and forms an inverted carry output;

a sum output is functionally connected to the output of said inverter I1105 and to the source of transistors T1127 and T1136;

the sources of transistors T1111, T1112 and T1114 are functionally connected to the most positive potential and the sources of transistors T1117, T1118, and T1120 to the most negative potential;

the drains of transistors T1112 and T1111 are functionally connected to the source of transistor T1113 and the drain of transistor T114 is functionally connected to the source of transistor T1116 and the drain of transistor T1120 is functionally connected to the source of transistor T1119;

the output of inverter I1102 is functionally connected to the drains of transistors T1125 and T1134 and the input of inverter T1105 is functionally connected to the sources of transistors T1123 and T1132;

the output of inverter I1103 is functionally connected to the gates of transistors T1122, T1125, T1130 and T1133 and the output of inverter I1104 to the gates of transistors T1113, T1116, T1127, T1124, T1135 and T1132; and the sources of transistors T1121, T1124, T1125 and T1128 are functionally connected together and the sources of transistors T1134, T1135 T1130 and T1131 are functionally connected together.

4. A digital multiplier with Booth encoding of a multiplier (N0, . . . N11) and diagonal propagation of the carry from one partial product to the other comprising;

a plurality of one bit adders, each comprising a carry stage and an adding stage, said adding stage of said adder being constructed in a fast CMOS complementary pass transistor logic with complementary analog CMOS switches which consist of a PMOS and a NMOS transistor, the source of said PMOS transistor being connected with the drain of said NMOS transistor and the drain of said PMOS transistor being connected with the source of said NMOS transistor, the gate of said PMOS transistor being coupled to receive inverted signals with respect to the gate of said NMOS transistor, wherein two partial output sum signals are generated by two of said switches which are connected with the input and with the output, respectively, of an inverter and wherein an output sum signal of said adder is available at the output of said inverter;

a first row (411) of function blocks (F) which calculate partial products from a multiplicand (401) and from a substring of the multiplier (401) and from a substring of the multiplier (N0, ..., N11) which has been coded in a Booth encoder circuit (403);

further rows (412, 414, 415, 417, 418) of basic building blocks (FA) which contain one of said function blocks (F) and one of said plurality of one-bit adders (+) and which calculate further partial products from the partial products from the first row or a previous row, respectively, and from further substrings of the multiplier (N0, ..., N11), which have been coded in further Booth encoder circuits (404, ..., 408) wherein the respective two or more lowest multiplication results bits (S0, ..., S9) from each row are calculated using two of said plurality of one-bit adders (+) and wherein groups of such rows (411, 412; 414,415; 417,418) are connected by a pipeline row (413, 416, 419); and a last row (410) with a multi-bit carry select adder circuit which is constructed from one-bit adders of said plurality of one-bit adders.

5. A multiplier according to claim 4, wherein:

summing outputs (S) of said one-bit adders (+, 52, 53) for two or more lowest multiplication result bits (S0, ..., S9) from each row are connected to multiplexors (MUX, 54) which select said summing outputs (S) according to the valid logic level for the carry input (CI) of said one-bit adders (+, 52, 53).

6. A multiplier according to claim 4, wherein a function block (F) of said first row comprises:

transistors T1021, T1024, T1025, T1026, T1030 and T1032 of PMOS type and transistors T1022, T1023, T1027, T1028, T1029, T1031, T1033 and T1034 of NMOS type;

NMOS transistors T1022, T1023, T1027 and T1028 have their bulk connected to the most negative potential (ground) and PMOS transistors T1021, T1024, T1025 and T1026 have their bulk connected to the most postivie potential (5 V);

transistor pairs T1031/T1032 and T1029/T1030 represent complementary analogue CMOS switches;

a multiplicand input signal (Mi) is connected to the drain of transistors T1022 and T1023 and to the source of transistors T1021 and T1024;

a next-block output signal (Sq) is connected to the drain of transistor T1021 and to the source of transistor T1023;

a previous-block input signal (Mq) is connected to the drain of transistor T1024, to the source of transistor T1022, and to the gate of transistors T1025 and T1127;

a shift left input signal (D) generate in said Booth encoder circuits (403, ..., 408) is connected to the input of an inverter I1011 and to the gate of transistors T1023 and T1024 and the output of said inverter I1011 is connected to the gate of transistors T1021 and T1022;

an inverted zeroing input signal (N) generated in said Booth encoder circuits (403, ..., 408) is connected to the gate of transistors T1026 and T1028 and the source of transistor T1027 is connected to the drain of transistor T1028 and the source of transistor T1028 is connected to ground and the source of transistors T1025 and T1026 is connected to supply voltage (5 V) amd the drain of transistors T1025 and T1026 is connected to the drain of transistors T1027, T1031 and T1034 and to the input of an inverter I1014;

an inverted complementation input signal (C') generated in said Booth encoder circuits (403, ..., 408) is connected to the gate of transistors T1030, T1031 and T1033, and to the input of an inverter I1012 and the output of inverter I1012 is connected to the gate of transistors T1029, T1032 smf Y1034; and the source of transistor T1031 is connected to the source of transistor T1029 and to the input of an inverter I1013 and the output of inverter I1014 is connected to the drain of transistors T1029 and T1033 and the source of transistors T1033 and T1034 is connected to the output of inverter I1013 and represents an output signal (P) of said function block.

7. A multiplier according to claim 4 wherein;

summing outputs (S) of said one-bit adders of said plurality of one-bit adders (+, 52, 53) for two or more lowest multiplication result bits (S0, ..., S9) from each row are connected to multiplexors (MUX, 54) which select said summing outputs (S) according to the valid logic level for the carry input (CI) of said one-bit adders (+, 52, 53).

8. A multiplier according to claim 4, wherein:

the multiple-bit carry select adder circuit of the last row is constructed using 4-bit adder circuits which contain one-bit adders of said plurality of one-bit adders, and wherein the summing outputs of said 4-bit adder circuits are functionally connected to multiplexers which select said summing outputs according to the valid logic level for the carry input of said 4-bit adder circuits.

9. A multiplier according to claim 4, wherein:

the multiple-bit carry select adder circuit of the last row is constructed using pairs of 4-bit adder circuits which contain one-bit adders of said plurality of one-bit adders, and wherein the summing outputs of said 4-bit adder circuits are functionally connected to multiplexers which select said summing outputs according to the valid logic level for the carry input of said of 4-bit circuits.

10. A multiplier according to claim 4 wherein:

the multiple-bit carry select adder circuit of the last row is constructed using 3 bit adder circuits which contain one-bit adders of said plurality of one-bit adders, and wherein the summing outputs of said 3-bit adder circuits are functionally connected to multiplexers which select said summing outputs according to the valid logic level for the carry input of said 3-bit adder circuits.

11. A multiplier according to claim 4, wherein:

the multiple-bit carry select adder circuit of the last row is constructed using pairs of 3 bit adder circuits which contain one-bit adders of said plurality of one-bit adders, and wherein the summing outputs of said 3-bit adder circuits are functionally connected to multiplexers which select said summing outputs according to the valid logic level for the carry input of said 3-bit adder circuits.

* * * * *